United States Patent
Farjad-Rad et al.

(10) Patent No.: US 7,333,578 B2
(45) Date of Patent: Feb. 19, 2008

(54) LINEAR DATA RECOVERY PHASE DETECTOR

(75) Inventors: Ramin Farjad-Rad, Mountain View, CA (US); Mark Horowitz, Menlo Park, CA (US)

(73) Assignee: The Board of Trustees of the Leland Stanford Junior University, Palo Alto, CA (US)

( * ) Notice: Subject to any disclaimer, the term of this patent is extended or adjusted under 35 U.S.C. 154(b) by 485 days.

(21) Appl. No.: 09/862,384

(22) Filed: May 22, 2001

(65) Prior Publication Data

US 2002/0009167 A1    Jan. 24, 2002

Related U.S. Application Data

(60) Provisional application No. 60/206,191, filed on May 22, 2000.

(51) Int. Cl.
    *H04L 7/00*      (2006.01)
(52) U.S. Cl. ........................ 375/355; 375/371; 375/373; 375/375; 375/376
(58) Field of Classification Search ................ 375/371, 375/372, 373, 374, 375, 376; 369/59.19
See application file for complete search history.

(56) References Cited

U.S. PATENT DOCUMENTS 6,151,282 A * 11/2000 Hamada et al. .......... 369/59.19
6,608,875 B1 * 8/2003 Wolaver .................... 375/375
6,650,720 B1 * 11/2003 Grung et al. ............... 375/375

OTHER PUBLICATIONS

Lee, Thomas H., et al., "*A 155-MHZ Clock Recovery Delay—and Phase-Locked Loop*," pp. 421-430, Reprinted from IEEE Journal of Solid-State Circuits, vol. SC-27, pp. 1736-1746, Dec. 1992.
Soyuer, Mehmet, "*A Monolithic 2.3-Gb/s 100-mW Clock and Data Recovery Circuit in Silicon Bipolar Technology*," pp. 450-453, Reprinted from IEEE Journal of Solid-State Circuits, vol. SC-38, pp. 1310-1313, Dec. 1993.
Savoj, Jafar, et al., "*A 10-Gb/s CMOS Clock and Data Recovery Circuit*," IEEE, pp. 136-139.
Poulton, John, et al., "*A Tracking Clock Recovery Receiver for 4Gb/s Signaling*," pp. 157-169.
Hu, Timothy H., "*A Monolithic 480 Mb/s Parallel AGC/Decision/Clock-Recovery Circuit in 1.2-µm CMOS*," pp. 437-443, Reprinted from IEEE Journal of Solid-State Circuits, vol. SC-28, pp. 1314-1320, Dec. 1993.

(Continued)

*Primary Examiner*—Curtis B. Odom
(74) *Attorney, Agent, or Firm*—Sawyer Law Group LLP

(57) ABSTRACT

An input data sequence is sampled according to a sampling clock such that a first set of samples corresponds to data values and a second set of samples corresponds to edges between the data values. The phase error between data transitions in the input sequence and the sampled edges is determined based on amplitudes of the sampled edges. The sampling clock's phase is adjusted based on the determined phase error. Typically, the phase error is proportional to an amplitude of a sampled edge. Sampled edge amplitude values are added or subtracted, according to the direction of each transition about each edge to form an error value which indicates the amount phase error.

6 Claims, 3 Drawing Sheets

OTHER PUBLICATIONS

Ishihara, Noboru, et al., "*A Monolithic 156 Mb/s Clock and Data Recovery PLL Circuit Using the Sample-and-Hold Technique*," pp. 431-436, Reprinted from IEEE Journal of Solid-State Circuits, vol. SC-29, pp. 1566-1571, Dec. 1994.

Farjad-Rad, Ramin, et al., "*A 0.3-µm CMOS 8-Gb/s 4-PAM Serial Link Trasceiver*," pp. 757-764.

Friedler, Alan, et al., "*A 1.0625Gbps Transceiver with 2x-Oversampling and Transmit Signal Pre-Emphasis*," IEEE, pp. 462-464.

Thon, L., "*540Mhz 21 mW MDFE Equalizer and Detector in 0.25µm CMOS*," IEEE.

Dally, William J., "*Transmitter Equalization for 4Gb/s Signaling*," pp. 29-38.

* cited by examiner

LINEAR DATA RECOVERY PHASE DETECTOR

RELATED APPLICATION

This application claims the benefit of U.S. Provisional Application No. 60/206,191, filed on May 22, 2000. The entire teachings of the above application are incorporated herein by reference.

BACKGROUND OF THE INVENTION

A timing-recovery circuit uses data transitions to adjust the phase of the sampling receiver clocks at the center of the data symbol, i.e., the "eye opening." There are two main approaches for timing recovery from a serial data: oversampling data recovery and tracking phase detection.

In the oversampling technique, each transmitted symbol is sampled N times (N≧3), and the sample that is closest to the symbol center is selected by logic as the data. See, for example, C.-K. Yang, R. Farjad, M. Horowitz, "A 0.5-mm CMOS 4-Gbps Serial Link Transceiver," IEEE JSSC, vol. 33, no. 5, May 1998. This approach allows very fast timing recovery, but suffers from large input loading (due to the large number of samplers), and phase quantization error (due to limited number of samples per symbol). Furthermore, it requires complex logic to process many samples at high frequency that dissipates large area and power.

In the tracking phase detection technique, a data phase detector measures the phase difference between the transition edge of the transmitted symbol and the sampling clock, typically by directly measuring the difference between the transition's zero-crossing and the clock pulse. This error value is used to align the sampling point at the symbol center. There are two general approaches for tracking phase detection: bang-bang phase correction and proportional phase error correction.

In bang-bang phase correction, the current status of a system is compared with a target status. In response to any measured error, the system is corrected each cycle by adding or subtracted a fixed amount of phase, according to the polarity of the error.

In proportional phase error correction, on the other hand, the system is corrected not by a fixed amount, but rather by an amount that is proportional to the measured error.

Traditional proportional tracking data phase locked loops (PLLs) offer good loop stability and bandwidth, but they typically require front-end circuits to operate at the same speed as the input serial data rate, which is one of the major bottlenecks for achieving higher speeds in a certain process technology. In addition, most proportional phase detectors potentially suffer from a systematic phase offset, because the manner in which they extract information from data transitions differs from the way they sample the data center. See Thomas H. Lee and John Bulzacchelli, "A 155-MHz Clock Recovery Delay and Phase-Locked Loop," IEEE JSSC, December 1992; Mehmet Syuer, "A Monolithic 2.3-Gbps 100-mW Clock and Data Recovery in Silicon Bipolar Technology," IEEE JSSC, December 1993; and Jafar Savoj and Behzad Razavi, "A 10-Gbps CMOS Clock and Data Recovery Circuit," Digest of technical papers, VLSI Symposium June, 2000.

Sampling transitions with the same mechanism used to sample the symbol centers eliminates the systematic phase offset in data recovery, and this approach has been used in sampling digital loops. See, for example, Timothy Hu and Paul Gray, "A Monolithic 480 Mb/s AGC/Decision/Clock-Recovery Circuit in 1.2-mm CMOS," IEEE JSSC, vol. 28, no. 12, December 1993; and Alan Fielder, et al, "A 1.0625 Gbps Transceiver with 2×-Oversampling and Transmit Signal Pre-emphasis," Digest of technical papers, ISSCC February 1997. However, conventional sampling digital loops use bang-bang control, resulting in limited bandwidth and stability, not to mention metastability in samplers when sampling at zero crossings.

SUMMARY OF THE INVENTION

Applicant has invented a novel proportional tracking phase detector which overcomes these problems.

In accordance with an embodiment of the present invention, a method for recovering a clock from a data input sequence begins by sampling, according to a sampling clock, the input sequence such that a first set of samples corresponds to data values and a second set of samples corresponds to edges between the data values. The phase error between data transitions in the input sequence and the sampling clock phases is determined based on amplitudes of the sampled edges. Finally, the sampling clock's phase is adjusted based on the determined phase error.

In at least one embodiment, the phase error is proportional to an amplitude of a sampled edge.

Sampled edge amplitude values are added or subtracted, according to the direction of each transition about each edge, i.e., whether the data goes from 0 to 1 or from 1 to 0, to form an error value which indicates the amount phase error. A sampled edge at which no transition occurs is ignored.

The recovery scheme of the present invention uses a parallel sampling architecture and processes the sampled values at a much lower speed, allowing it to phase-detect multi-Gbit/s data rates in moderate CMOS technologies.

Although conventional bang-bang detectors use a similar sampling architecture, they suffer from low loop bandwidth and stability due to the bang-bang control. Therefore in this design, we use the analog values of the transition samples (proportional to the phase offset) to control the loop. This results in a linear control for the PLL which can offer a much larger loop bandwidth and stability. Larger loop bandwidth also results in large capture range of the PLL.

The logic in the digital approaches for clock recovery is sensitive to metastability that can occur more frequently when the receiver samples data transitions at zero crossings and tries to resolve the sampled value to either zero or one. The present invention does not suffer from this problem, as it only uses the analog values of the samples at transitions or edges.

When in lock, the loop experiences no control voltage ripple due to the charge-pump injections to the VCO control voltage node, which reduces total clock phase wander.

The systematic offset for this detector is zero, as opposed to conventional linear phase detectors. This feature improves the overall system phase-error.

The present invention can also provide phase detection for multi-level data patterns, e.g., N-level pulse amplitude modulation (N-PAM) signals. The multi-level feature enables the link to transmit higher data rates over a bandwidth-limited channel. Ramin Farjad-Rad et al., "A 0.3-µm CMOS 8-Gb/s 4-PAM Serial Link Transceiver," IEEE Journal of Solid State Circuits, Vol. 35, No. 5, May 2000, pp. 757-764, incorporated by reference herein in its entirety, discusses 4-level PAM.

BRIEF DESCRIPTION OF THE DRAWINGS

The foregoing and other objects, features and advantages of the invention will be apparent from the following more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE INVENTION

The present invention employs a phase detector which extracts the phase information of a Non-Return-to-Zero (NRZ) data stream. A receiver data recovery loop uses this detector to recover the timing of the incoming serial data.

Figure 1:
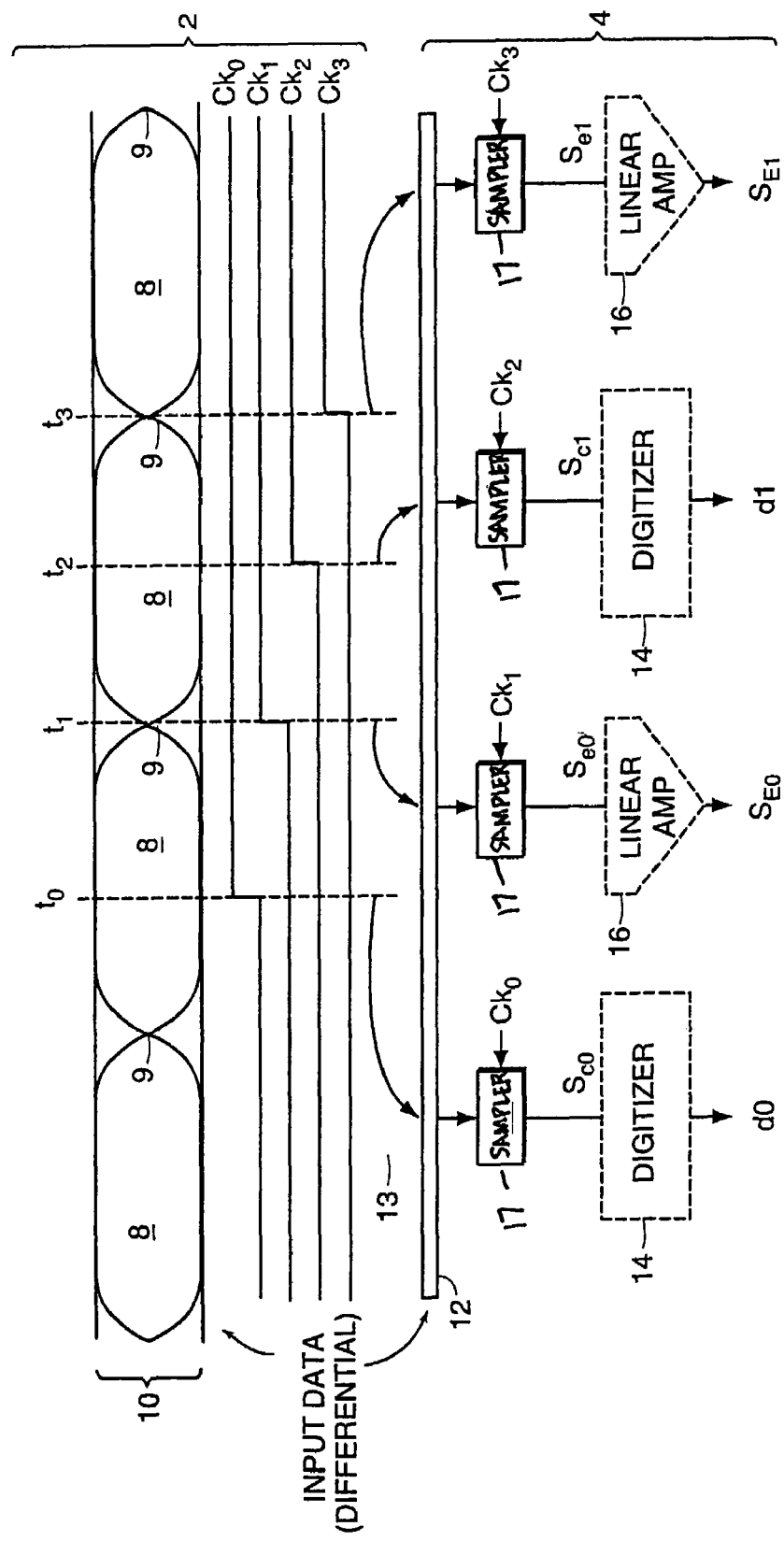
FIG. 1 is a combined timing diagram and schematic diagram illustrating a portion of an embodiment of the present invention.

FIG. 1 is a timing diagram 2 combined with a schematic 4 that illustrates a portion of an embodiment with a 1:5 demultiplexing receiver front-end using 2× oversampling, i.e., each data bit is sampled at both its center and its transition point. The 1:5 demultiplexing receiver samples five data bits in a single clock period using ten phases (2×5 phases, due to 2× oversampling) of the clock, plus the first data bit of the next cycle.

In the timing diagram 2, a differential input signal 10 carries a sequence of data values 8, separated by data transitions 9. Rising edges on clock signals $Ck_0$-$Ck_9$, of which only the first four are shown, occur at twice the data rate. Note that clock signals $Ck_0$, $Ck_2$, . . . , $Ck_8$ occur respectively at times $t_0$, $t_2$, . . . , $t_8$, i.e., during data values 8. Clock signals $Ck_1$, $Ck_3$, . . . , $Ck_9$, on the other hand, occur respectively at times $t_1$, $t_3$, . . . , $t_9$, i.e at or near data transitions or edges 9.

As indicated by the arrows 13 between the timing diagram 2 and the schematic 4, each clock rising edge causes a sampler 17 to sample the input signal 12 (corresponding to 10 of the timing diagram). Thus, at time $t_0$, on the rising edge of $Ck_0$, a data value 8 is sampled as $S_{c0}$(. At time $t_1$, on the rising edge of $Ck_1$, the input signal 12 is sampled at the transition or edge 9, to produce $S_{e0}$.

In the 1:5 embodiment, this is repeated until there are a total of ten samples. When the phase locked loop of the present invention is properly locked to the input data 10, 12, half of the ten samples represent symbol values at the center of the symbols ($S_c$), and half are samples at the data transitions or symbol edges ($S_e$).

The $S_c$ samples are digitized by digitizers 14 and result in the received data bits d that are next resynchronized to a global clock. The sampled edges $S_e$, on the other hand, are amplified by linear amplifiers 16 and maintained as analog values $S_E$, to be used as part of a linear phase detector for timing recovery to produce signal $S_{E0}$.

Figure 2:
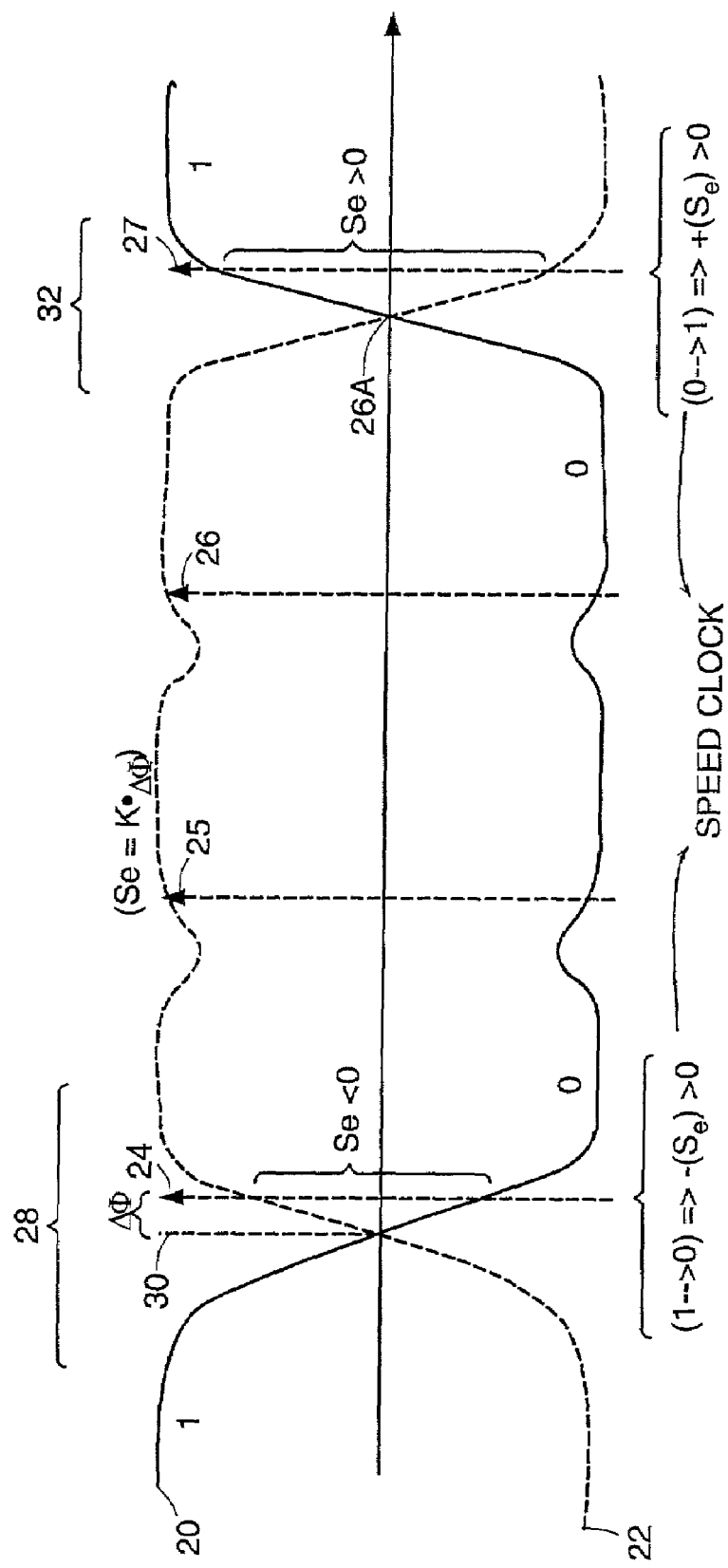
FIG. 2 is a timing diagram illustrating the phase detection method of an embodiment of the present invention for a special case of binary data and a lagging sampling clock.

FIG. 2 illustrates the phase detection method of the present invention for a special case of binary data and a lagging sampling clock. Arrows 24-27 show the clock sampling points only at symbol boundaries, i.e., edges. The differential input signal is shown as 20 and 22. The data value transitions at 28 from 1 to 0. The data contains three consecutive 0s before transitioning back at 32 to a value of 1.

When the loop is not in lock and a transition occurs such as at 28, the edge sample amplitudes $S_e$ are non-zero and proportional to the phase error $\Delta\Phi$ between data zero crossing 30 and clock edge 24:

$$S_e = k \cdot \Delta\Phi$$

The amplified edge sample values $S_E$ are added together with correct polarity, determined by the direction of each transition, and used to adjust the loop control voltage to correct for the phase error. As the correction on the loop control voltage is proportional to the phase error, this method results in a proportional loop control. The present invention thus combines the better loop stability of a linear or proportional loop with the ability to minimize sampling phase offset resulting from the symmetrical manner in which data and clock phase differences are compared using bang-bang sampling.

In bang-bang control, fixed-amplitude correcting pulses are always applied to the control line, resulting in ripple and, hence, timing error. In the present invention, however, the analog edge samples ($S_e$) are zero at the transitions when in lock, resulting in zero sum voltage, i.e., no ripple, on the loop control line.

Figure 3:
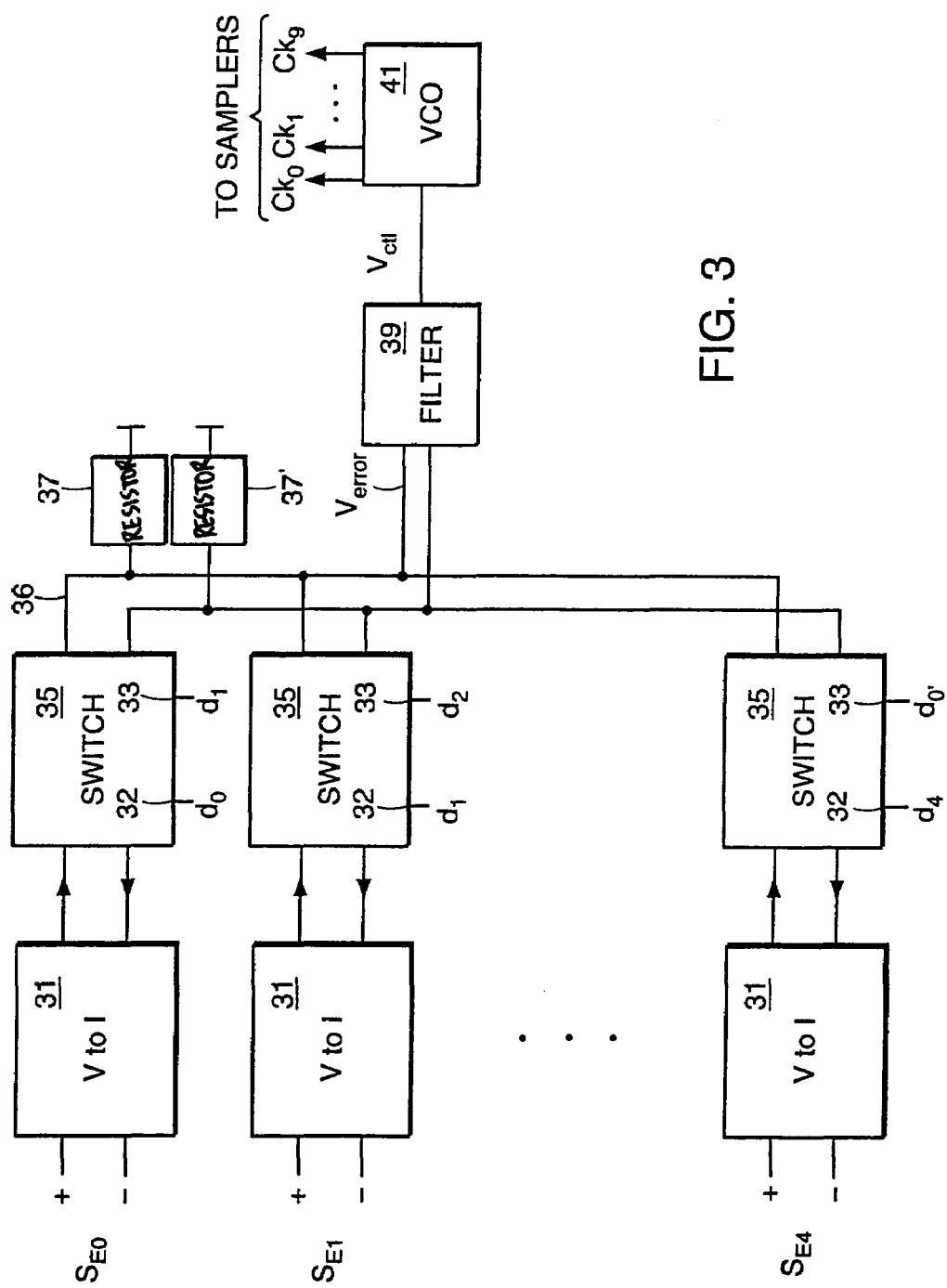
FIG. 3 is a block diagram of a data phase detector according to an embodiment of the present invention.

FIG. 3 is a block diagram of a data phase detector according to the present invention. Each of five differential analog edge samples $S_{E0}$-$S_{E4}$ is converted by a voltage-to-current converter 31, e.g., a differential amplifier, into a current. The resulting current is fed into a switch block 35, which selects the correct polarity based on the previous data value 32 and next data value 33, e.g., d0 and d1 for $S_{E0}$. Where no transition has occurred, SE samples are ignored by turning off all of the switches in the corresponding switch block 35. Note that the last sampled data value d0' is the first data sample of the next set of values.

The currents corresponding to $S_E$ values, with correct polarity, are then added together by the hard-wiring at 36. This summed current is then converted to a voltage through resistors 37 or functionally equivalent active components, to form $V_{error}$. $V_{error}$ is filtered by filter 39, resulting in the control voltage $V_{ctl}$. $V_{ctl}$ drives the voltage controlled oscillator (VCO) 45 that generates the sampling clock phases $Ck_0$-$Ck_9$. The VCO is typically a ring oscillator so that the various clock phases are easily available.

The loop acts to force $V_{error}$, as a result the edge sample values $S_e$, to zero. In doing so, the respective phase difference between the data and the sampling clocks approaches zero.

In one embodiment, $V_{error}$ actually drives a charge pump, which, in conjunction with filter 39, produces the control voltage $V_{ctl}$.

While this invention has been particularly shown and described with references to preferred embodiments thereof, it will be understood by those skilled in the art that various changes in form and details may be made therein without departing from the scope of the invention encompassed by the appended claims.

What is claimed is:

1. A phase detector, comprising:
   a sampling clock generator which generates a clock at an oversampling rate compared to a data rate of an input sequence;
   a first sampler which samples data values of the input sequence;

a second sampler which samples edges between the data values; and a data phase detector which determines phase error between data transitions in the input sequence and the sampling clock phases, based on amplitudes of the sampled edges, the determined phase error being fed into the sampling clock generator to adjust the phase of the sampling clock, wherein the phase detector comprises:

switches for adjusting polarities of sampled edges based on previous and next data values, the polarity-adjusted sampled edges being added together to form a phase error indication, the phase error indication driving the sampling clock generator.

2. The phase detector of claim 1, wherein the phase error is proportional to an amplitude of a sampled edge.

3. The phase detector of claim 1, wherein a phase detector logic ignores a sampled edge if no transition occurs between the previous and next data values.

4. The phase detector of claim 1, wherein the data phase detector comprises plural voltage-to-current converters which convert sampled edge voltages to currents, such that the swatches switch current polarities, and wherein the sampled edge cuffed are added together via hard-wiring.

5. The phase detector of claim 1, where the sampled edges are added with positive polarity if next data value is larger than previous data value and are added with negative polarity if a next data value is smaller than a previous data value.

6. The phase detector of claim 1, wherein the phase detector subtracts the average value of a previous data value and a next data value from a sampled edge before adding to the rest of the data values for phase adjustment.

* * * * *